(12) United States Patent
Park

(10) Patent No.: US 8,076,187 B2
(45) Date of Patent: Dec. 13, 2011

(54) MASK PATTERN, METHOD OF FABRICATING THIN FILM TRANSISTOR, AND METHOD OF FABRICATING ORGANIC LIGHT EMITTING DISPLAY DEVICE USING THE SAME

(75) Inventor: Hye-Hyang Park, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 13/013,261

(22) Filed: Jan. 25, 2011

(65) Prior Publication Data

US 2011/0159647 A1 Jun. 30, 2011

Related U.S. Application Data

(62) Division of application No. 11/648,402, filed on Dec. 28, 2005, now abandoned.

(30) Foreign Application Priority Data

Dec. 28, 2005 (KR) .................. 10-2005-0131920

(51) Int. Cl.
*H01L 21/84* (2006.01)
(52) U.S. Cl. ................... 438/166; 257/E21.561
(58) Field of Classification Search .......... 438/151–166; 257/E21.561
See application file for complete search history.

(56) References Cited

U.S. PATENT DOCUMENTS

| 6,177,301 | B1 | 1/2001 | Jung |
| 6,322,625 | B2 | 11/2001 | Im |
| 6,864,130 | B2 * | 3/2005 | Koo et al. ............. 438/166 |
| 7,008,863 | B2 | 3/2006 | Kim et al. |
| 2005/0142453 | A1 | 6/2005 | Seo et al. |

FOREIGN PATENT DOCUMENTS

| JP | 2005-197658 | 7/2005 |
| KR | 2002-0093194 | 12/2002 |
| KR | 10-2005-0037912 A | 4/2005 |
| KR | 10-2005-0065108 | 6/2005 |

(Continued)

OTHER PUBLICATIONS

Korean Patent Abstracts, Publication No. 1020050100805 A, dated Oct. 20, 2005, in the name of Joe Sung You.

(Continued)

*Primary Examiner* — Richard A. Booth
(74) *Attorney, Agent, or Firm* — Christie, Parker & Hale, LLP

(57) ABSTRACT

A method of fabricating a polycrystalline silicon thin film for a thin film transistor (TFT), a mask pattern used for the method, and a method of fabricating a flat panel display device using the method and the mask pattern. In one embodiment, a mask pattern includes a plurality of regions, each of the regions having at least one of one or more transparent portions or one or more non-transparent portions. A total area of the one or more transparent portions and the one or more non-transparent portions in one of the regions is substantially equal to a total area of the one or more transparent portions and the one or more non-transparent portions in at least one other of the regions. A total area of the transparent portions in the mask pattern is different from a total area of the non-transparent portions in the mask pattern.

13 Claims, 14 Drawing Sheets

FOREIGN PATENT DOCUMENTS

| | | |
|---|---|---|
| KR | 10-2005-0100805 | 10/2005 |
| WO | WO 97/45827 | 12/1997 |

OTHER PUBLICATIONS

Korean Patent Abstracts, Publication No. 1020050037912 A, dated Apr. 25, 2005, in the name of Hye Hyang Park et al.

Korean Patent Abstract, Publication No. 1020020093194 A, Published Dec. 16, 2002, in the name of Yang.

Patent Abstracts of Japan, Publication No. 2005-197658, dated Jul. 21, 2005, in the name of Eok Su Kim, et al.

Korean Patent Abstracts, Publication No. 1020050050065108 A, dated Jun. 29, 2005, in the name of Hyun Sik Seo et al.

\* cited by examiner

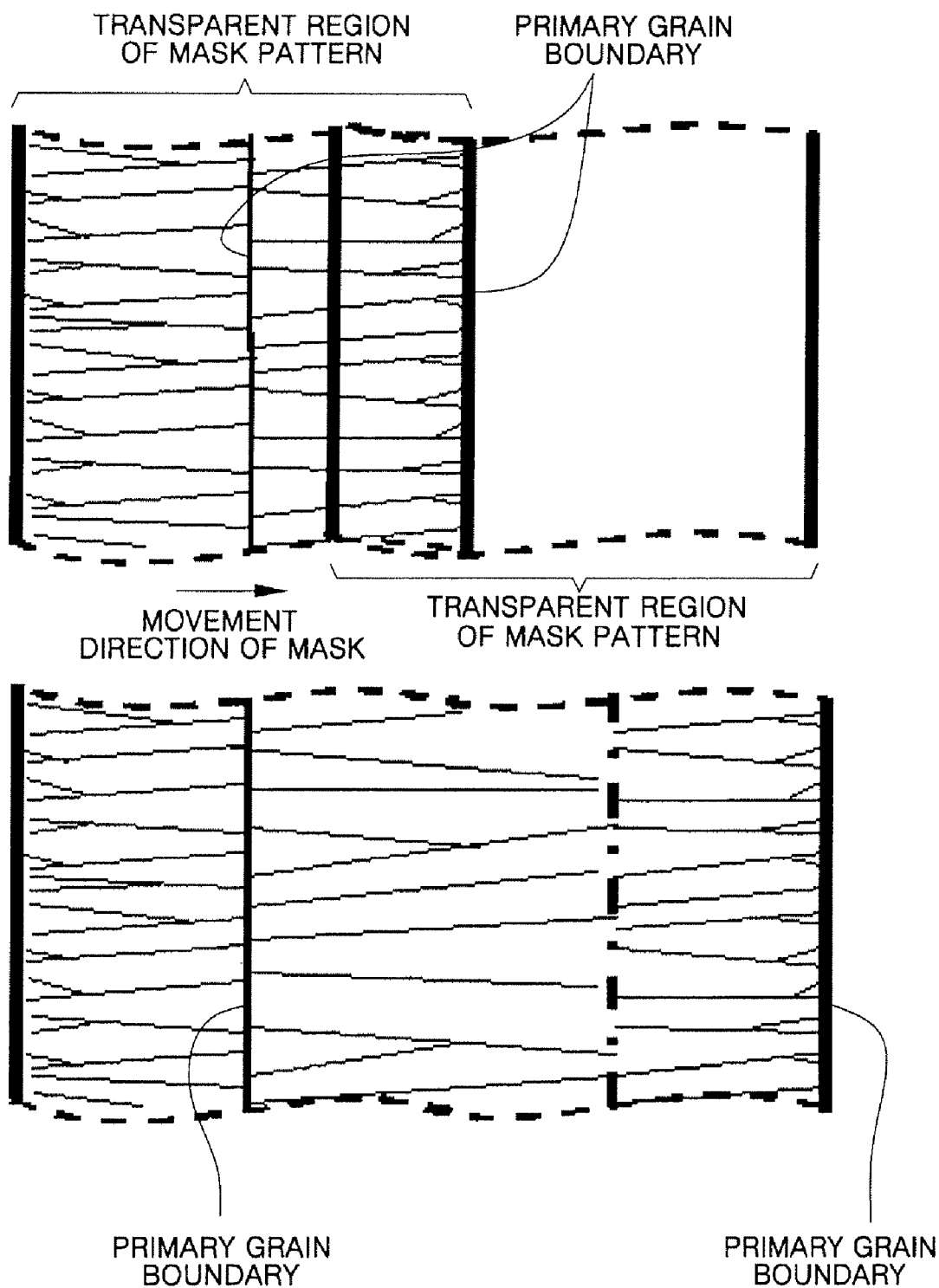

MASK PATTERN, METHOD OF FABRICATING THIN FILM TRANSISTOR, AND METHOD OF FABRICATING ORGANIC LIGHT EMITTING DISPLAY DEVICE USING THE SAME

CROSS-REFERENCE TO RELATED APPLICATION

This application is a divisional of U.S. patent application Ser. No. 11/648,402 filed on Dec. 28, 2006, which claimed priority to and the benefit of Korean Patent Application No. 10-2005-0131920, filed on Dec. 28, 2005, the entire content of which is incorporated by reference.

BACKGROUND OF THE INVENTION

1. Field of the Invention

The present invention relates to a method of fabricating polycrystalline silicon for a thin film transistor (TFT), a mask pattern used for the method, and a method of fabricating a flat panel display device using the same.

2. Description of the Related Art

In general, sequential lateral solidification (SLS) is a technique in which an amorphous silicon layer is irradiated with a laser beam two or more times consecutively to cause grains of crystal silicon to grow laterally, thereby crystallizing the amorphous silicon layer. A polycrystalline silicon grain fabricated by the SLS technique (or method) has a cylindrical shape elongated in one direction, and a grain boundary is formed between adjacent grains due to the finite size of the grains.

According to the SLS method, a polycrystalline or single crystalline particle can be used to form a large silicon grain on a substrate. It has been reported that, when a thin film transistor (TFT) is fabricated in this manner, characteristics similar to those of a TFT fabricated with a single crystalline silicon can be obtained.

FIGS. 1A, 1B and 1C illustrate a conventional SLS method.

According to the SLS method, as illustrated in FIG. 1A, a laser beam is radiated onto an amorphous silicon thin film layer through a mask having a region through which the laser beam can pass and a region through which the laser beam cannot pass, and thus amorphous silicon of the thin film layer melts at the region through which the laser beam passes.

When cooling begins after the laser beam irradiation is finished, crystallization first occurs at an interface between the amorphous silicon and the molten silicon. Latent heat of solidification generated during the crystallization forms a temperature gradient in which temperature gradually decreases along a direction from the interface between the amorphous silicon and the molten silicon to the molten silicon layer.

As such, referring to FIG. 1B, heat flows in a direction from a mask interface to a middle of the molten silicon layer. Consequently, polycrystalline silicon grains laterally grow until the molten silicon layer is completely solidified, and thus a polycrystalline silicon thin film layer having cylindrical grains elongated in one direction is formed.

Here, the grains grow from a non-molten amorphous silicon layer, and a grain boundary is formed where grains growing in opposite directions contact each other. Such a grain boundary, formed perpendicular to a direction of grain growth, is referred to as a "primary grain boundary".

Subsequently, as illustrated in FIG. 1C, the mask is moved incrementally to expose a part of the amorphous silicon thin film layer and a part of the previously crystallized polycrystalline silicon layer, and the laser beam irradiation is repeated. Then, as a result of the amorphous silicon and crystallized silicon being melted and then cooled down, silicon atoms become attached to the previously formed polycrystalline silicon grains that are covered by the mask and thus have not melted, and thus lengths of the grains increase.

Therefore, according to the SLS method, it is possible to control a grain size according to the size of a mask pattern and the number of repetitions of a laser beam irradiation.

FIG. 2 illustrates a conventional mask pattern employed in a polycrystalline silicon thin film fabrication method using a conventional 2-shot SLS method, and FIG. 3 illustrates an energy density of a laser beam used when polycrystalline silicon is fabricated using the mask pattern shown in FIG. 2, and the polycrystalline silicon fabricated thereby.

Referring to FIG. 2, when crystallization is performed using the mask pattern of FIG. 2 and energy density in a laser beam is not substantially uniform (i.e., an energy density at a middle portion is higher than that at an edge portion), as illustrated in FIG. 3, the crystallinity of the crystallized polycrystalline silicon may vary between portions irradiated with the laser beam (or pulse). Such varying crystallinity may affect TFT characteristics.

When the laser energy density is not substantially uniform while amorphous silicon is crystallized according to the SLS method, non-uniformity in a luminance of a display employing the crystallized silicon may result.

FIGS. 4A, 4B, and 4C are plan views of a polycrystalline thin film in different stages of formation according to a crystallization method using a mask pattern employed in a method of fabricating a polycrystalline silicon thin film using a laser shot mixing technique according to the conventional SLS method. According to the laser shot mixing technique, which is performed along an x axis of the mask pattern, i.e., a laser beam is scanned along an x-direction, crystallization regions are formed at transparent patterns along the x axis, the transparent patterns are shifted by a distance (e.g., a predetermined distance) along the direction of a y axis perpendicular to the x axis, and thus non-crystallized regions are crystallized.

Referring first to FIG. 4A, after a laser beam is radiated onto an amorphous silicon layer using a common mask having a transparent region and a non-transparent region, amorphous silicon melts, and then the molten amorphous silicon is solidified to thereby form polycrystalline silicon. Subsequently, as illustrated in FIG. 4B, when the mask is shifted by a distance (e.g. a predetermined distance) and the laser beam is radiated again, polycrystalline silicon of the crystallized region of a portion at which the amorphous silicon and the transparent regions overlap each other melts again and is crystallized as illustrated in FIG. 4C. In this manner, the laser beam is repeatedly scanned and radiated, such that the polycrystalline silicon of the crystallized region of the portion at which the amorphous silicon and the mask pattern transparent regions overlap each other melts and is solidified again. Consequently, crystallization is achieved.

FIG. 5 is a photograph of line muras or stripe effects displayed when polycrystalline silicon fabricated by SLS using the laser shot mixing technique is applied to a display.

As illustrated in FIG. 5, the shot mixing technique can reduce luminance non-uniformity but cannot completely remove the line muras or stripe effects. As such, the luminance non-uniformity cannot be perfectly corrected. In addition, the laser shot mixing technique uses a minimum 4 shot process to form one crystal, which requires an increase in processing time.

U.S. Pat. No. 6,322,625 discloses a method of depositing amorphous silicon on an entire substrate and then transforming the amorphous silicon on the entire substrate into polycrystalline silicon or crystallizing a selected region of the substrate using an SLS method.

In addition, in U.S. Pat. No. 6,177,301, large silicon grains are formed using an SLS method. When an active channel direction is parallel to a direction along which the grains are grown by the SLS method upon fabrication of a TFT for a liquid crystal display (LCD) device having a drive circuit and a pixel array, a barrier effect of a grain boundary with respect to the direction of an electric charge carrier is minimized, such that it is possible to obtain TFT characteristics similar to those of single crystalline silicon. However, according to these patents, when an active channel region is perpendicular to the direction of grain growth, there are numerous grain boundaries acting as a trap for charge carriers, and thus the TFT characteristics greatly deteriorate.

A TFT in a drive circuit and a TFT in a pixel cell region may be positioned generally at a right angle to each other when an active matrix display is fabricated. Here, in order to improve a uniformity of characteristics between the TFTs without greatly deteriorating the characteristics of each TFT, an active channel region is fabricated to extend along a direction forming an angle of between 30° and 60° with a crystal growth direction, such that it is possible to improve the uniformity of the device.

However, the above-described approach also uses the SLS method, and thus has a drawback wherein non-uniformity of grains of polycrystalline silicon may result due to non-uniformity of laser energy density.

An approach for configuring a laser beam pattern to have a triangular shape and inducing crystallization while horizontally moving the triangular beam pattern is disclosed in Korean Patent Laid-Open Publication No. 2002-0093194. This approach has a drawback because it can be nearly impossible to crystallize the entire substrate, with a non-crystallized region always remaining.

SUMMARY OF THE INVENTION

An aspect of the present invention provides a method of fabricating a polycrystalline silicon thin film for a thin film transistor (TFT) in which luminance non-uniformity caused by energy non-uniformity in a laser beam is reduced upon fabrication of the polycrystalline silicon thin film using a sequential lateral solidification (SLS) method, and a mask pattern used for the method.

Another aspect of the present invention provides a method of fabricating a flat panel display device using the polycrystalline silicon thin film fabrication method and the mask pattern.

In one embodiment of the present invention, a mask pattern includes a plurality of regions, each of the regions having at least one of one or more transparent portions or one or more non-transparent portions. A total area of the one or more transparent portions and the one or more non-transparent portions in one of the regions is substantially equal to a total area of the one or more transparent portions and the one or more non-transparent portions in at least one other of the regions. A total area of the transparent portions in the mask pattern is different from a total area of the non-transparent portions in the mask pattern.

In another embodiment of the present invention, a method of fabricating a TFT includes forming amorphous silicon on a substrate, radiating a laser beam on the amorphous silicon, crystallizing the amorphous silicon using a mask pattern, and forming a semiconductor layer having a source region, a drain region and a channel region. The mask pattern includes a plurality of regions, each of the regions having at least one of one or more transparent portions or one or more non-transparent portions. A total area of the one or more transparent portions and the one or more non-transparent portions in one of the regions is substantially equal to a total area of the one or more transparent portions and the one or more non-transparent portions in at least one other of the regions. A total area of the transparent portions in the mask pattern is different from a total area of the non-transparent portions in the mask pattern.

In yet another embodiment of the present invention, a method of fabricating an organic light emitting display device includes: forming amorphous silicon on a substrate; radiating a laser beam on the amorphous silicon; crystallizing the amorphous silicon using a mask pattern comprising a plurality of regions, each of the regions having at least one of one or more transparent portions or one or more non-transparent portions; forming a semiconductor layer having a source region, a drain region and a channel region of a thin film transistor (TFT); and forming a first electrode, an organic layer including at least an emission layer, and a second electrode on the TFT.

BRIEF DESCRIPTION OF THE DRAWINGS

The above and other aspects and features of the present invention will become more apparent by describing certain exemplary embodiments thereof with reference to the attached drawings in which:

FIGS. 1A, 1B and 1C illustrate a conventional sequential lateral solidification (SLS) method;

DETAILED DESCRIPTION

The foregoing and other aspects and features of the present invention will become more apparent from the following detailed description of exemplary embodiments of the present invention and the accompanying drawings.

In general, a mobility of a thin film transistor (TFT) varies according to a size of a polycrystalline silicon grain. As the grain increases in size (or length), the mobility of the TFT increases. For example, when the length of the grain is 3.0 μm, the mobility decreases by about 15% compared to the case where the length is 3.5 μm.

A current characteristic value of a TFT is in direct proportion to the mobility of the TFT. Therefore, when the grain size of polycrystalline silicon is changed in (or at) a region onto which a laser beam is radiated, luminance non-uniformity caused by energy non-uniformity in the laser beam can be reduced.

In more detail, by configuring a grain size to be small, a small amount of current is allowed to flow at a relatively uniform voltage, such that it is possible to control an amount of luminance increase due to an energy density increase of the laser beam to be more uniform.

In embodiments of the present invention, a mask pattern is formed and employed such that a laser shot is radiated onto each partial region in a crystallization region of amorphous silicon a different number of times.

When amorphous silicon is crystallized by a sequential lateral solidification (SLS) method using a laser, the number of laser shots is made to vary per region by adjusting areas of one or more transparent portions and one or more non-transparent portions of a mask pattern, and thus crystallization characteristics are made to be more uniform.

The mask pattern of the present invention is divided into n regions. A total area of transparent portions and non-transparent portions in one of the n regions is substantially equal to that in at least one other of the n regions, and a total area of the transparent portions is different from that of the non-transparent portions. Here, n is a natural number.

Hereinafter, the present invention will be described in more detail with reference to exemplary embodiments thereof.

Figure 1A:
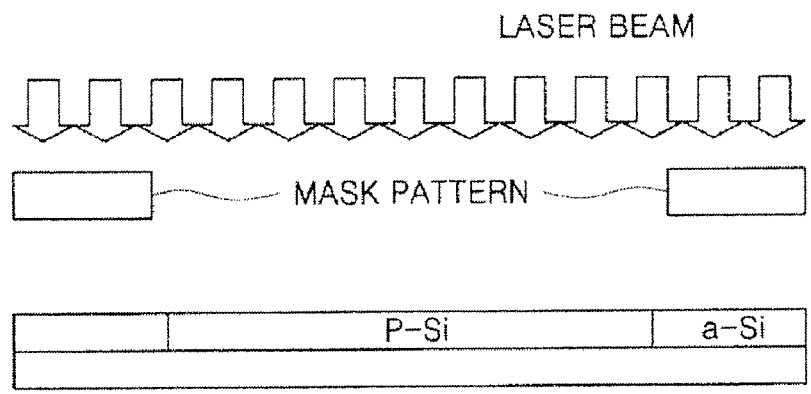
Figure 1B:
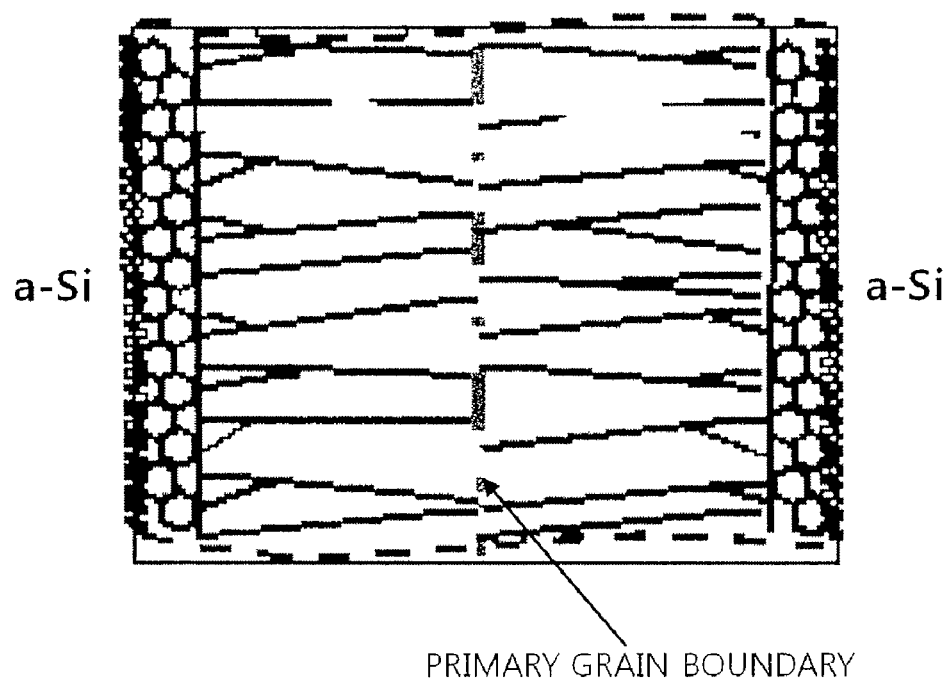
Figure 2:
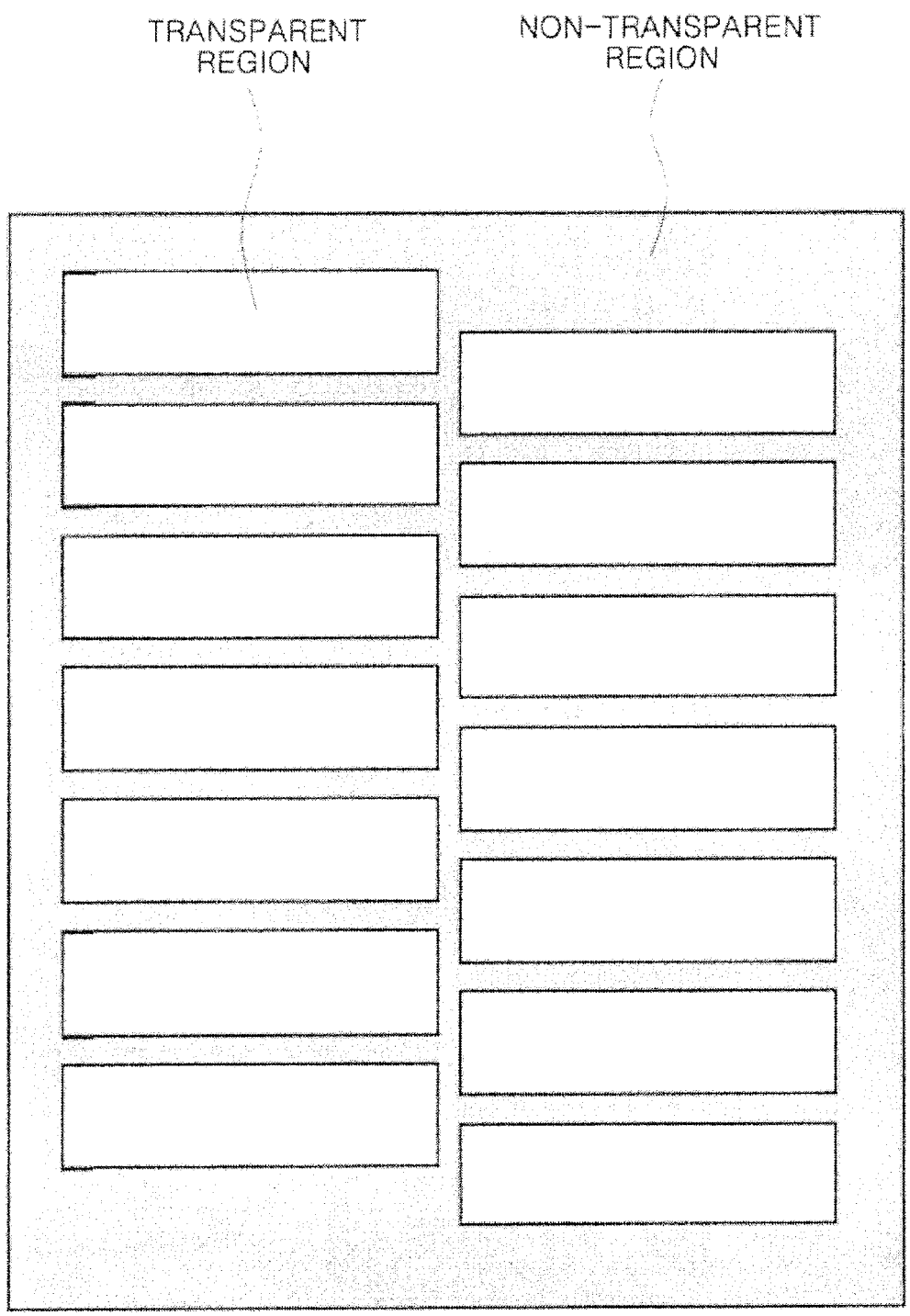
FIG. 2 illustrates a mask pattern employed in a polycrystalline silicon thin film fabrication method using a conventional 2-shot SLS method.
Figure 3:
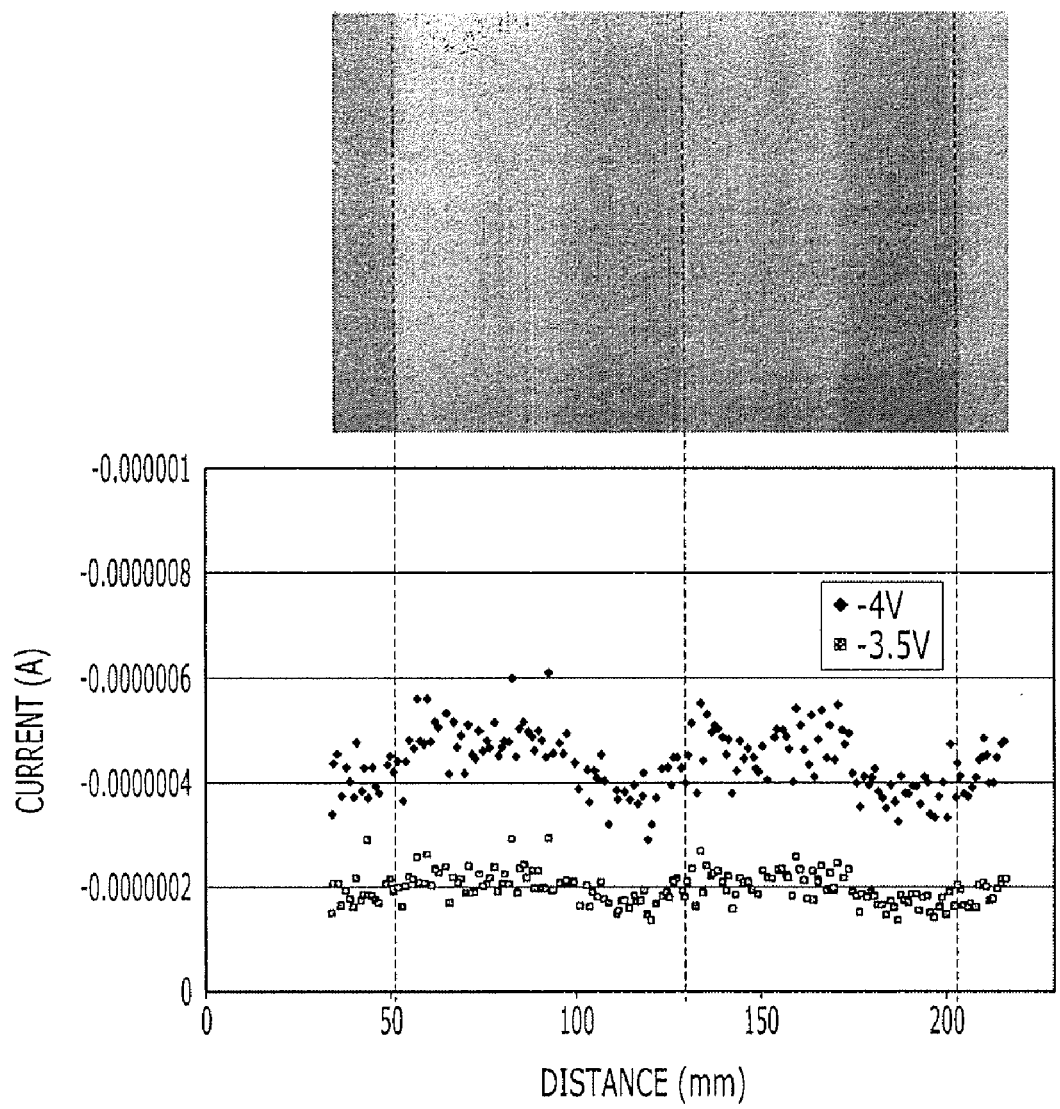
FIG. 3 illustrates an energy density of a laser beam used when polycrystalline silicon is fabricated using the mask pattern of FIG. 2, and polycrystalline silicon fabricated by the same.
Figure 4A:
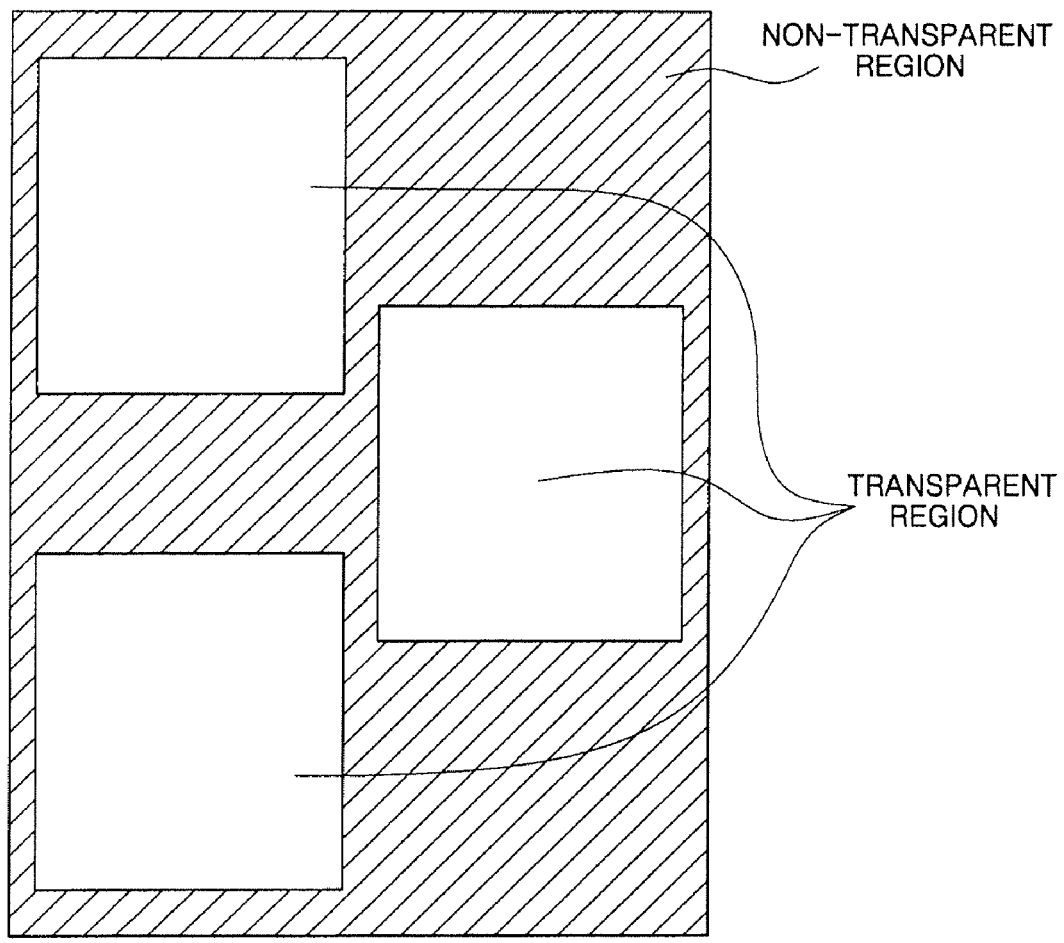
FIGS. 4A, 4B and 4C illustrate a crystallization method using a mask pattern employed in a polycrystalline silicon thin film fabrication method using a laser shot mixing technique of a conventional SLS method.
Figure 4B:
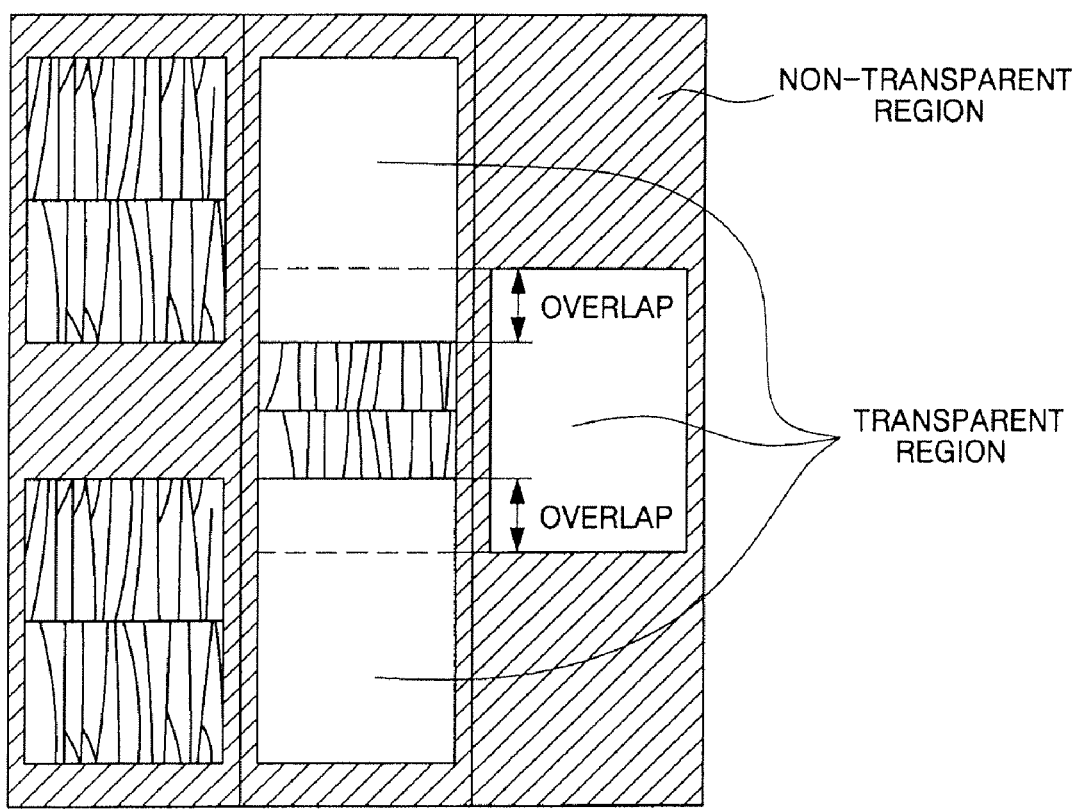
Figure 4C:
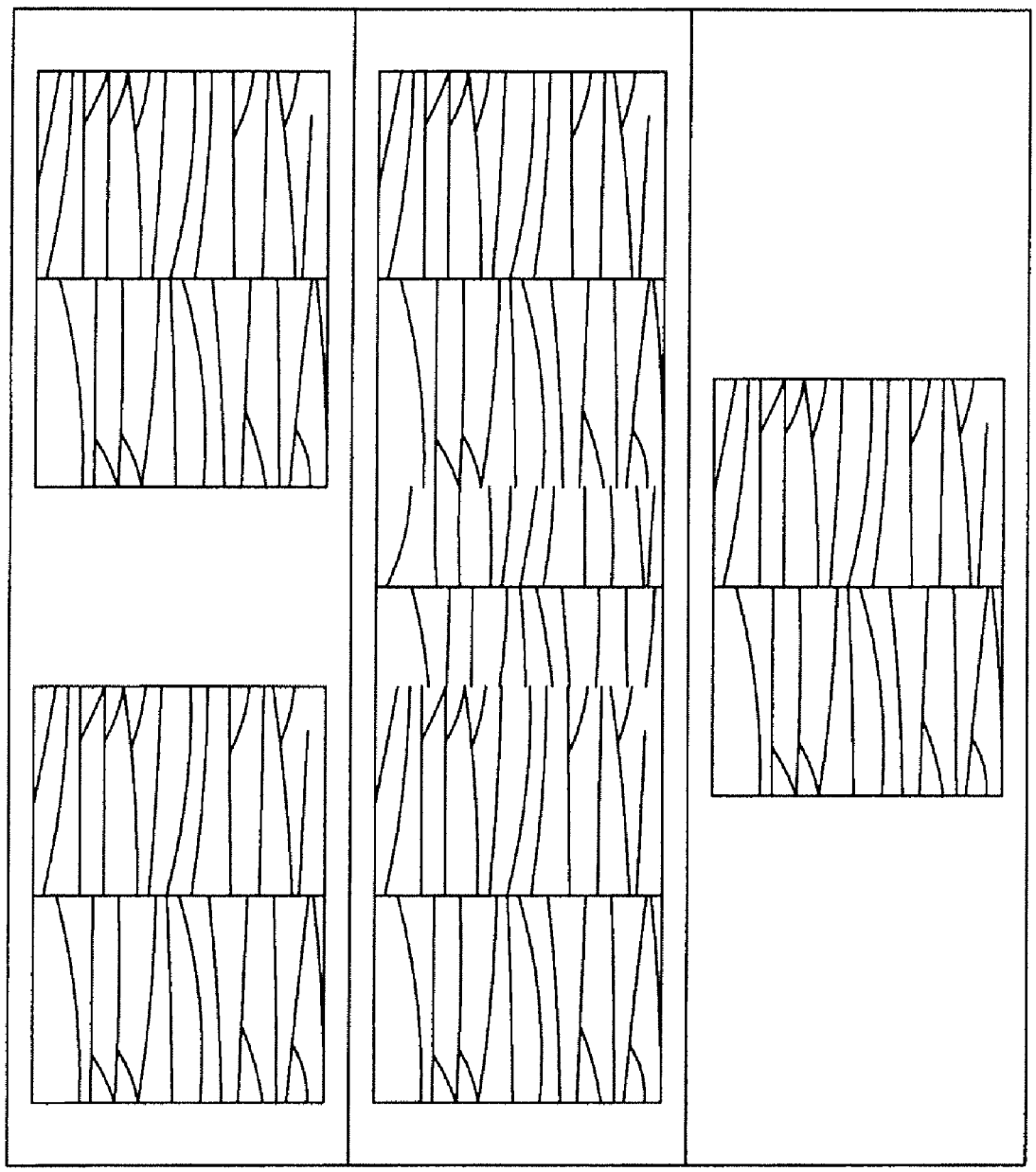
Figure 5:
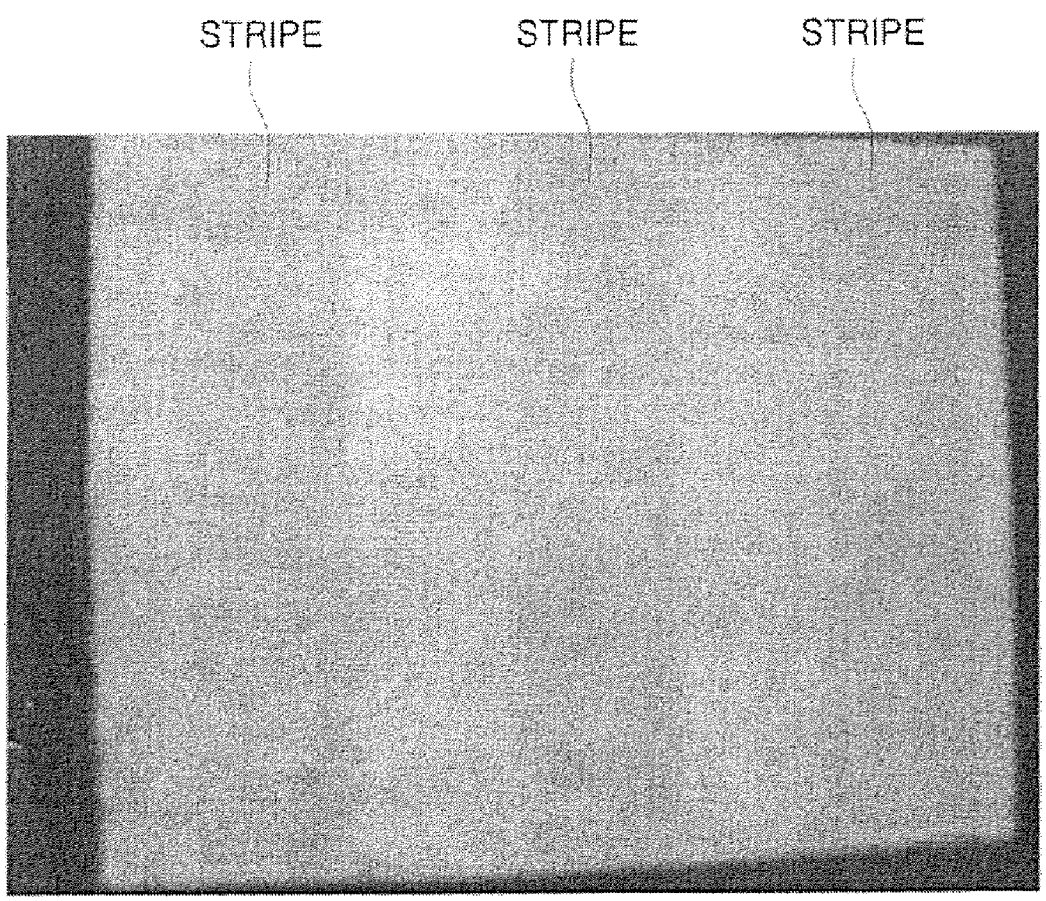
FIG. 5 is a photograph of stripe effects displayed when polycrystalline silicon fabricated by SLS crystallization using the laser shot mixing technique is applied to a display.
Figure 6:
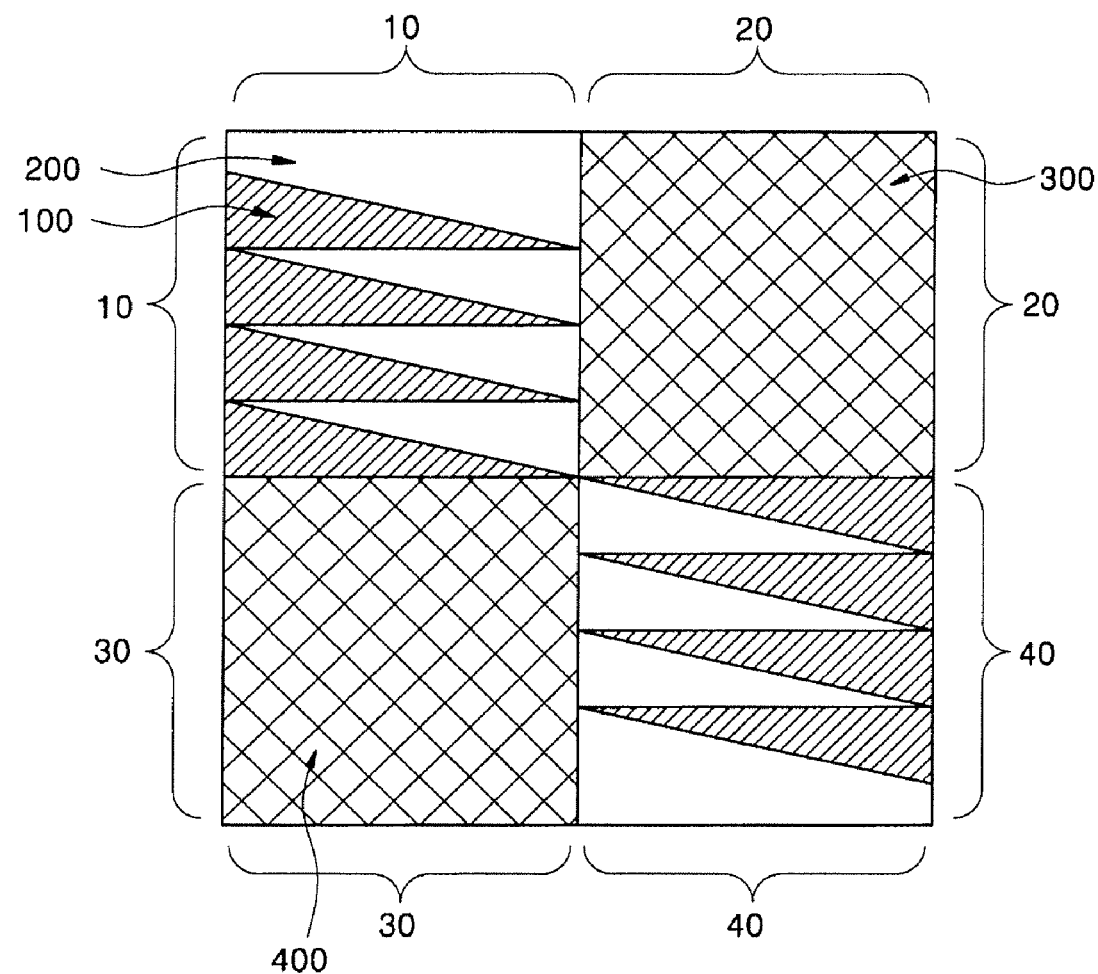
FIG. 6 illustrates a mask pattern according to a first exemplary embodiment of the present invention.
Figure 7:
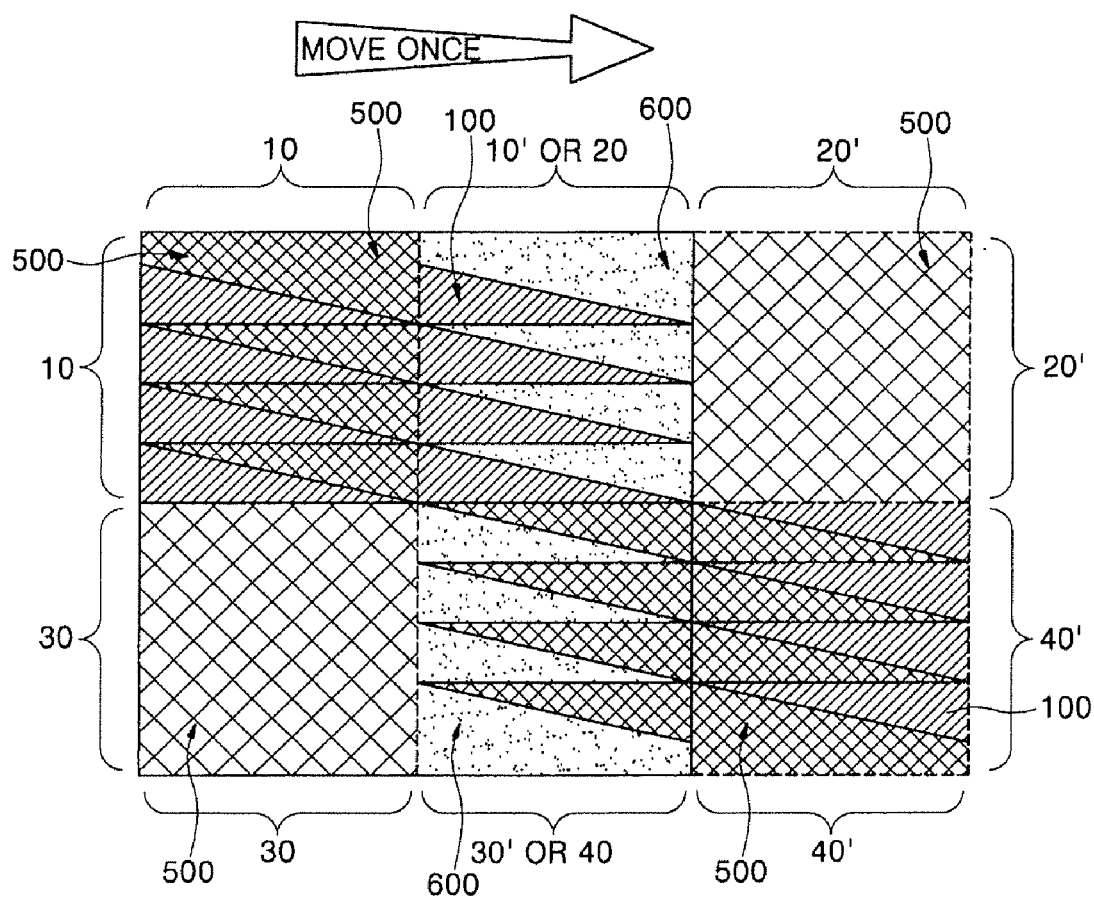
FIG. 7 illustrates a method of crystallizing amorphous silicon using the mask pattern of FIG. 6 according to a 2-shot SLS method.

FIG. 6 illustrates a mask pattern according to a first exemplary embodiment of the present invention, and FIG. 7 illustrates a method of crystallizing amorphous silicon using the mask pattern of FIG. 6 according to a 2-shot SLS method.

Referring to FIG. 6, the mask pattern according to the first exemplary embodiment of the present invention is divided into four regions 10, 20, 30 and 40 with respect to an x-axis and a y-axis.

In each of the regions 10 and 40, which are disposed diagonally with respect to each other, non-transparent portions 100 and transparent portions 200 are formed. Here, the total area of the non-transparent portions 100 and the transparent portions 200 in the region 10 is substantially equal to a total area of the non-transparent portions 100 and the transparent portions 200 in the region 40, but a total area of the transparent portions 200 is different from a total area of the non-transparent portions 100. In addition, a portion 300 of the region 20 and a portion 400 of the region 30 may be transparent portions or non-transparent portions.

By way of example, the portion 300 of the region 20 is a transparent portion and, as illustrated in FIG. 7, a laser shot is radiated during the 2-shot process, and the mask pattern is moved in between the two shots. Here, the mask pattern regions 10 and 30 are moved to be positioned, respectively, at positions 10' and 30', which are respective former positions of the regions 20 and 40. As such, the laser shot is radiated once onto the portion at which the non-transparent portion 100 of the region 10 is positioned, and twice onto the region 600 at which the transparent portion 200 of the region 10 is positioned. Also, a region 500 at which the portion 300 of the region 20 is positioned is radiated once by the laser shot.

As a result of the laser shot being radiated n times, the layer at the region 20 is made up of regions at which the laser shot is radiated once to n times, and thus non-uniformity of the crystallization region caused by the energy density non-uniformity of the irradiated laser shot decreases.

The total area of the transparent portions may be larger than that of the non-transparent portions, or vice versa. In one embodiment, the total area of the transparent portions is larger than that of the non-transparent portions because the larger the area of the transparent portions, the higher an energy efficiency may be.

In one embodiment, regions having both the transparent portions and the non-transparent portions are formed in a diagonal direction from each other such that the number of laser shots can vary. As such, luminance non-uniformity caused by non-uniformity of crystallinity may be prevented or reduced.

Here, the shape of the non-transparent portions may be that of a triangle, a rectangle, a lozenge, or a circle, but embodiments of the present invention are not limited thereto.

Figure 8:
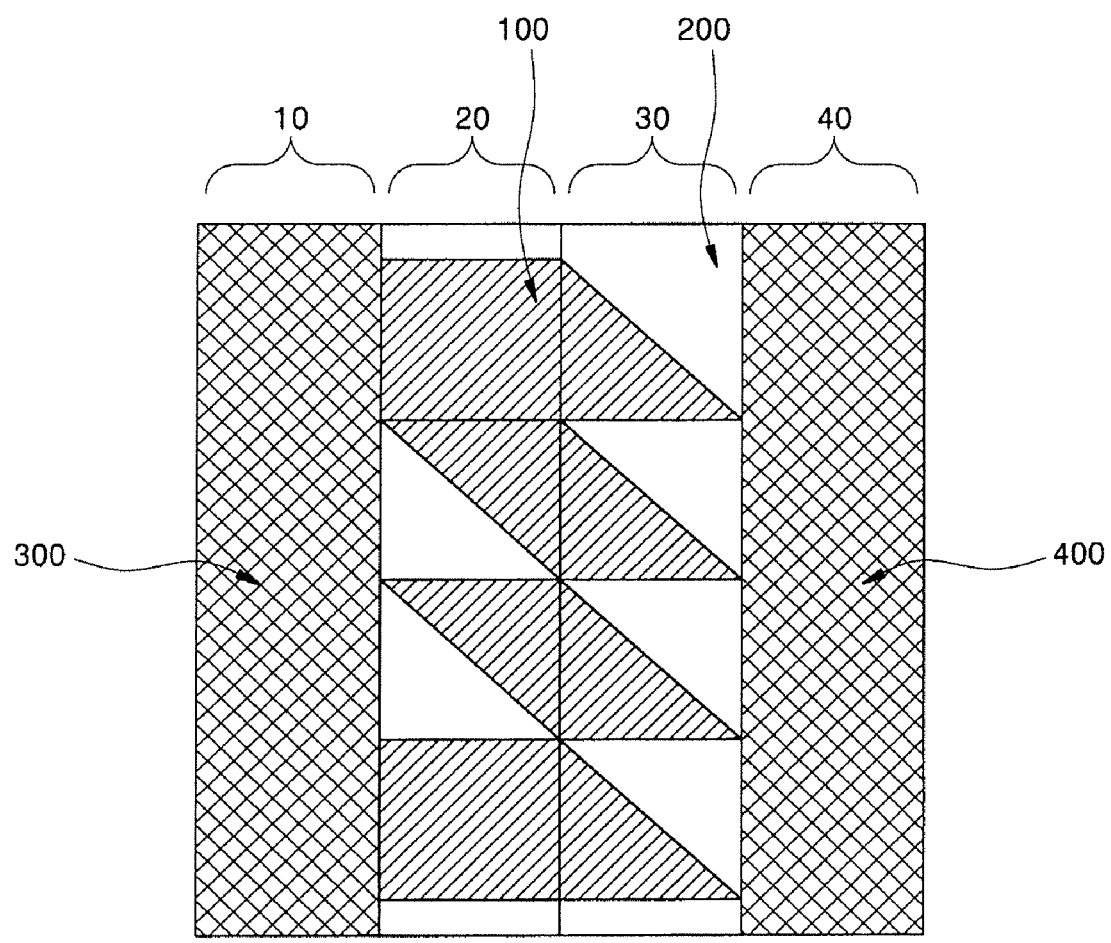
FIG. 8 illustrates a mask pattern according to a second exemplary embodiment of the present invention.

FIG. 8 illustrates a mask pattern according to a second exemplary embodiment of the present invention.

Referring to FIG. 8, the mask pattern is divided into four regions. Among the four regions, regions 20 and 30 have a structure in which transparent portions 200 and non-transparent portions 100 are mixed, and regions 10 and 40 have a transparent portion or a non-transparent portion only. In this embodiment, the total area of the transparent portions and non-transparent portions in the region 20 and the total area of the transparent portions and non-transparent portions in the region 30 are substantially equal to each other, and a total area of the transparent portions is different from that of the non-transparent portions.

Therefore, in the second embodiment, regions irradiated by different numbers of laser shots coexist. Consequently, since non-uniformity of the crystallization is more widely distributed, it is possible to prevent luminance non-uniformity.

Figure 9:
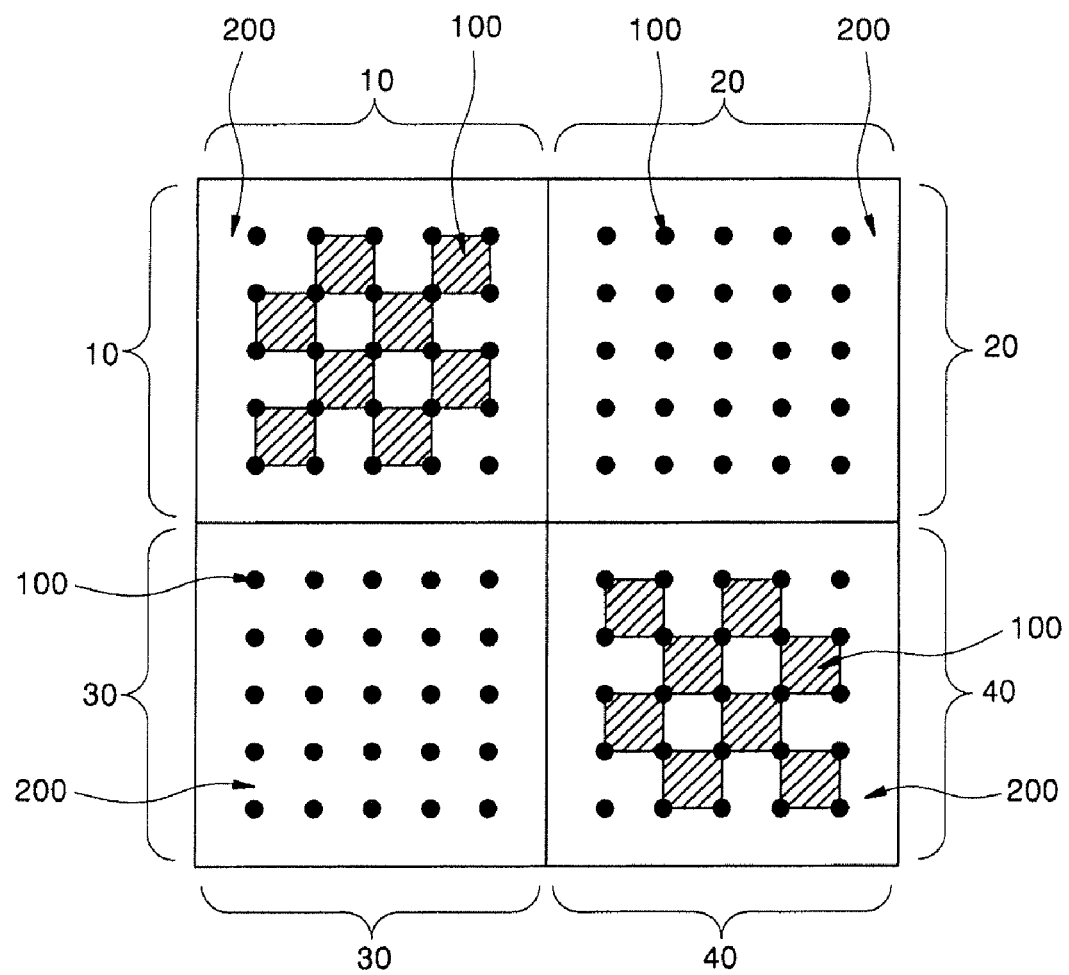
FIG. 9 illustrates a mask pattern according to a third exemplary embodiment of the present invention.

FIG. 9 illustrates a mask pattern according to a third exemplary embodiment of the present invention.

Referring to FIG. 9, the mask pattern of the third embodiment has dotted patterns 100 for non-transparent portions, and some regions among the dotted patterns are configured to be non-transparent portions.

Figure 10:
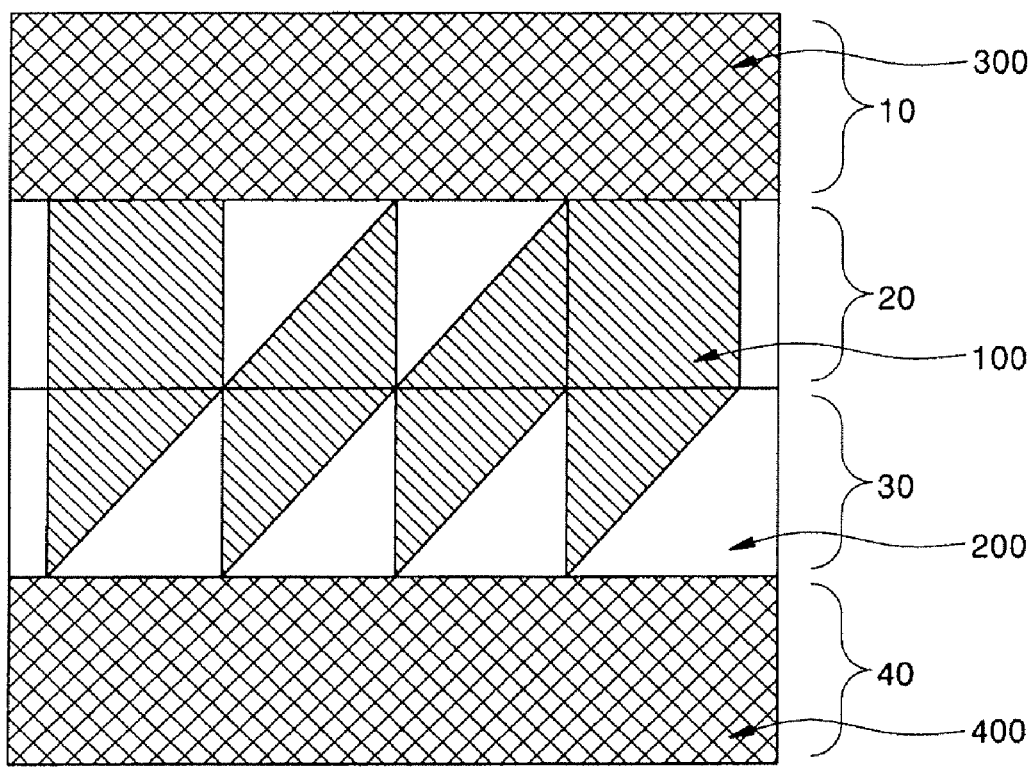
FIG. 10 illustrates a mask pattern according to a fourth exemplary embodiment of the present invention.

FIG. 10 illustrates a mask pattern according to a fourth exemplary embodiment of the present invention.

Referring to FIG. 10, unlike the second embodiment in which the mask pattern is divided in a vertical direction, the mask pattern of the fourth embodiment is divided into four regions in a horizontal direction. Transparent portions 200 and non-transparent portions 100 coexist in regions 20 and 30, and a portion 300 of a region 10 and a portion 400 of a region 40 are transparent portions or non-transparent portions. In this embodiment, a total area of the transparent portions and non-transparent portions in the region 20 and a total area of the transparent portions and non-transparent portions in the region 30 are substantially equal to each other, and the total area of the transparent portions is different from that of the non-transparent portions.

As described above, in this embodiment, a laser shot is radiated onto a layer of amorphous silicon a plurality of times, i.e., n times, and thereby a process of crystallizing a region and re-crystallizing the crystallized region is repeated. Hereupon, the effects of grain boundaries on electric field mobility, etc. are reduced (or minimized), and it is possible to remove stripe effects (due to luminance non-uniformity) generated in a conventional process.

Figure 11:
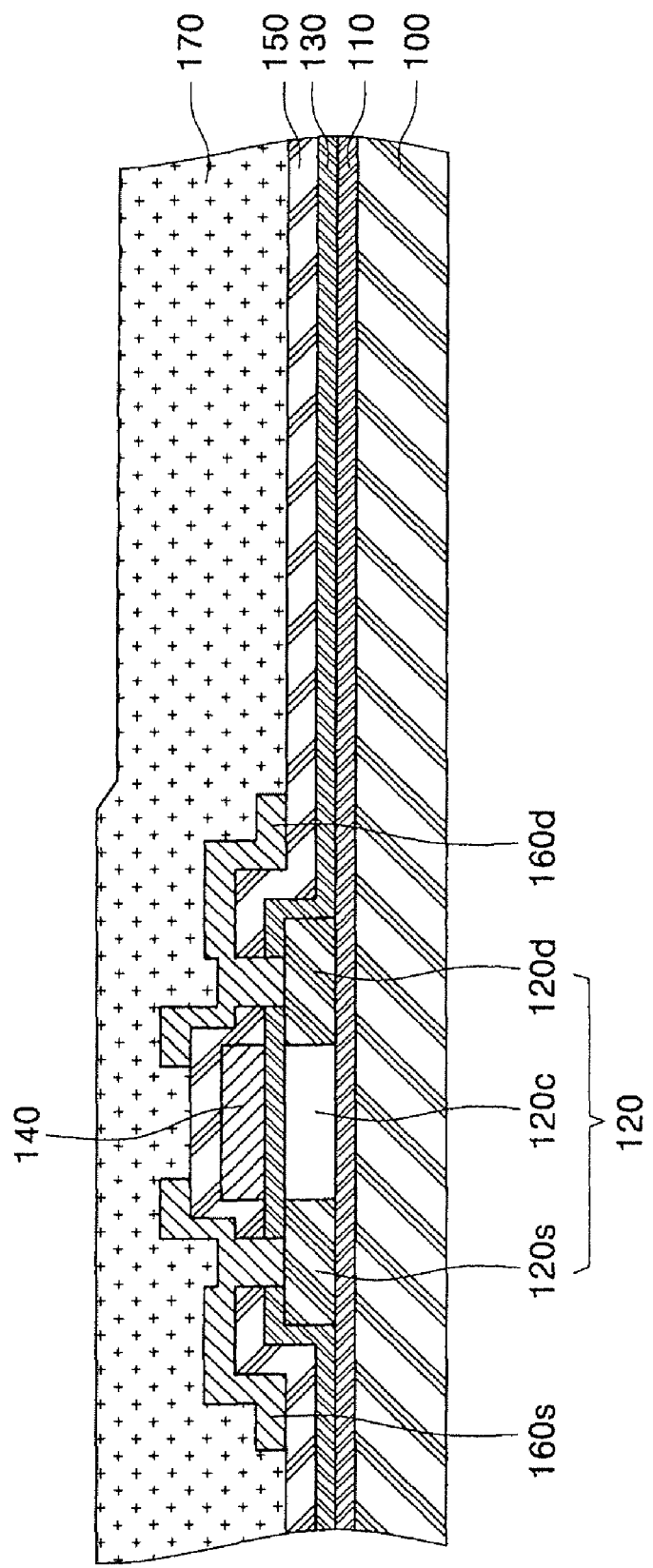
FIG. 11 is a cross-sectional view of a thin film transistor (TFT) using polycrystalline silicon as a semiconductor layer, which is formed by a method of crystallizing amorphous silicon into polycrystalline silicon using a mask pattern according to an exemplary embodiment of the present invention.

FIG. 11 is a cross-sectional view of a thin film transistor (TFT) using polycrystalline silicon as a semiconductor layer, which is formed by a method of crystallizing amorphous silicon into polycrystalline silicon using a mask pattern according to an exemplary embodiment of the present invention.

Referring to FIG. 11, first, a buffer layer 110 is formed on a substrate 100. The substrate 100 may be an insulating transparent substrate, a plastic substrate, or a transparent metal substrate. The buffer layer 110 may be selectively used, and may be a $SiN_x$ layer, a $SiO_2$ layer, or a combination of these two layers.

Subsequently, amorphous silicon is deposited on the buffer layer 110. Then, the amorphous silicon layer is crystallized into a polycrystalline silicon layer 120 using a mask pattern of one of the first, second, third, or fourth exemplary embodiments by the SLS method, and then patterned, such that a semiconductor layer 120 is formed.

Next, a gate insulating layer 130 is formed of $SiN_x$, $SiO_2$, or a combination of these two materials over the entire substrate 100, and a gate electrode material is deposited on the gate insulating layer 130 and then patterned, thereby forming a gate electrode 140. Subsequently, p-type dopant or n-type dopant is applied to (or doped into) the semiconductor layer 120 using the gate electrode 140 as a mask, and thereby source and drain regions 120s and 120d are formed on the semiconductor layer 120.

Then, an interlayer insulating layer 150 is formed over the entire substrate 100, and contact holes for allowing contact between a source electrode 160s and the source region 120s and between a drain electrode 160d and the drain region 120d are formed in the gate insulating layer 130 and the interlayer insulating layer 150.

The gate insulating layer 130, the gate electrode 140, and the interlayer insulating layer 150 may be formed of one or more suitable conventional materials.

In one embodiment, the TFT is a top-gate type in which the gate electrode 140 is formed on the semiconductor layer 120. However, embodiments of the present invention can also be applied to a bottom-gate TFT in which the gate electrode 140 is formed under the semiconductor layer 120.

In addition, an insulating layer 170 is formed on the source and drain electrodes 160s and 160d. The insulating layer 170 may be a passivation layer, a planarization layer, or a laminated layer thereof. Thus, the TFT is completed.

Subsequently, a pixel electrode is formed on the insulating layer 170. A pixel definition layer is formed on the entire substrate 100 to cover an edge of the pixel electrode, and then patterned to expose an upper part of the pixel electrode. Then, an organic layer including an organic emission layer and an upper electrode are formed on the pixel electrode by a suitable conventional process, and thus an organic light emitting display device is completed.

Although embodiments of the present invention have been described in relation to an organic light emitting display device by way of example, the polycrystalline silicon thin film fabricated according to the exemplary embodiments can be applied to any active-type flat panel display device.

As described above, when crystallizing amorphous silicon using a laser, embodiments of the present invention use a mask pattern thereof to prevent polycrystalline silicon from being non-uniformly crystallized due to a non-uniformity of laser energy.

While the present invention has been described with reference to certain exemplary embodiments thereof, it will be understood by those skilled in the art that a variety of modifications may be made to the described embodiments without departing from the spirit and scope of the present invention as defined by the appended claims and their equivalents.

What is claimed is:

1. A method of fabricating a thin film transistor (TFT), the method comprising:
   forming amorphous silicon on a substrate;
   dividing the amorphous silicon on the substrate into rectangular silicon regions including a first silicon region, each of the silicon regions having a first width and a first length;
   radiating a laser beam on the amorphous silicon;
   crystallizing the amorphous silicon using a mask pattern, comprising crystallizing the first silicon region by radiating the laser beam through the mask pattern for a plurality of N laser shots on the amorphous silicon, N being greater than or equal to 3, the mask pattern comprising a corresponding N contiguous laser shot regions each having the first width and the first length, each of the laser shot regions for serving as a mask while radiating the laser beam onto the first silicon region during a respective one of the laser shots, the mask pattern moving width-wise by the first width or length-wise by the first length with respect to the substrate between consecutive ones of the laser shots, each of the laser shot regions having one or more transparent portions and zero or more non-transparent portions, no two of the laser shot regions having a same total area of respective said one or more transparent portions, the crystallizing of the first silicon region yielding a plurality of regions comprising N radiated regions, each of the radiated regions being subjected to a different number of the laser shots from 1 to N; and
   forming a semiconductor layer having a source region, a drain region, and a channel region.

2. The method according to claim 1, further comprising forming a gate electrode on the substrate before forming the semiconductor layer.

3. The method according to claim 1, further comprising forming a gate electrode on the semiconductor layer after forming the semiconductor layer.

4. The method according to claim 1, wherein said crystallizing the amorphous silicon comprises performing sequential lateral solidification (SLS).

5. The method according to claim 1, wherein said radiating the laser beam comprises radiating the laser beam two or more times.

6. The method according to claim 1, wherein the total area of the transparent portions in the mask pattern is larger than the total area of the non-transparent portions in the mask pattern.

7. The method according to claim 1, wherein the total area of the non-transparent portions in the mask pattern is larger than the total area of the transparent portions in the mask pattern.

8. The method according to claim 1,
   wherein at least two of the laser shot regions having one or more non-transparent portions are disposed diagonally to each other.

9. The method according to claim 1, wherein the laser shot regions divide the mask pattern along a vertical direction.

10. The method according to claim 1, wherein the laser shot regions divide the mask pattern along a horizontal direction.

11. A method of fabricating an organic light emitting display device, comprising:
   forming amorphous silicon on a substrate;
   dividing the amorphous silicon on the substrate into rectangular silicon regions including a first silicon region, each of the silicon regions having a first width and a first length;
   radiating a laser beam on the amorphous silicon;
   crystallizing the amorphous silicon using a mask pattern comprising a plurality of N contiguous laser shot regions each having the first width and the first length, N being greater than or equal to 3, each of the laser shot regions having one or more transparent portions and zero or more non-transparent portions, no two of the laser shot regions having a same total area of respective said one or more transparent portions, the crystallizing of the amorphous silicon comprising crystallizing the first silicon region by radiating the laser beam through the mask pattern for a corresponding N laser shots on the amorphous silicon, each of the laser shots for radiating the laser beam through a respective one of the laser shot regions onto the first silicon region, the mask pattern moving width-wise by the first width or length-wise by the first length with respect to the substrate between consecutive ones of the laser shots, the crystallizing of the first silicon region yielding a plurality of regions comprising N radiated regions, each of the radiated regions being subjected to a different number of the laser shots from 1 to N;
   forming a semiconductor layer having a source region, a drain region, and a channel region of a thin film transistor (TFT); and
   forming a first electrode, an organic layer including at least an emission layer, and a second electrode on the TFT.

12. The method according to claim 11,
   wherein a total area of the transparent portions in the mask pattern is different from a total area of the non-transparent portions in the mask pattern.

13. The method according to claim 12, wherein the total area of the transparent portions in the mask pattern is larger than the total area of the non-transparent portions in the mask pattern.

* * * * *

UNITED STATES PATENT AND TRADEMARK OFFICE
CERTIFICATE OF CORRECTION

| | | |
|---|---|---|
| PATENT NO. | : 8,076,187 B2 | Page 1 of 1 |
| APPLICATION NO. | : 13/013261 | |
| DATED | : December 13, 2011 | |
| INVENTOR(S) | : Hye-Hyang Park | |

It is certified that error appears in the above-identified patent and that said Letters Patent is hereby corrected as shown below:

On the Title Page

Item (62) Related U.S. Application Data     Delete "Dec. 28, 2005"

Insert -- Dec. 28, 2006 --

In the Claims

Column 8, Claim 1, line 22     Delete "a"

Column 9, Claim 11, line 19     Delete "a"

Signed and Sealed this
Seventeenth Day of September, 2013

Teresa Stanek Rea
*Deputy Director of the United States Patent and Trademark Office*